United States Patent
Fujita et al.

(10) Patent No.: US 10,861,703 B2
(45) Date of Patent: Dec. 8, 2020

(54) METHOD OF MANUFACTURING SUBSTRATE AND SEMICONDUCTOR DEVICE

(71) Applicant: CANON KABUSHIKI KAISHA, Tokyo (JP)

(72) Inventors: Hirohisa Fujita, Saitama (JP); Kenji Fujii, Yokohama (JP); Satoshi Ibe, Yokohama (JP); Makoto Watanabe, Yokohama (JP); Shuhei Oya, Kawasaki (JP); Yusuke Hashimoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 123 days.

(21) Appl. No.: 16/052,857

(22) Filed: Aug. 2, 2018

(65) Prior Publication Data
US 2019/0051533 A1    Feb. 14, 2019

(30) Foreign Application Priority Data

Aug. 9, 2017 (JP) ................. 2017-154555

(51) Int. Cl.
*H01L 21/306* (2006.01)
*H01L 21/78* (2006.01)
*B41J 2/16* (2006.01)

(52) U.S. Cl.
CPC ...... *H01L 21/30604* (2013.01); *B41J 2/1603* (2013.01); *B41J 2/1628* (2013.01); *B41J 2/1629* (2013.01); *B41J 2/1632* (2013.01); *B41J 2/1635* (2013.01); *B41J 2/1639* (2013.01); *B41J 2/1645* (2013.01); *H01L 21/78* (2013.01)

(58) Field of Classification Search
CPC ...................................... H01L 21/306
See application file for complete search history.

(56) References Cited

U.S. PATENT DOCUMENTS

2011/0316051 A1* 12/2011 Takada ................ H01L 21/0237
257/200
2017/0203569 A1    7/2017 Matsumoto et al.

FOREIGN PATENT DOCUMENTS

JP       2007-250761 A    9/2007

* cited by examiner

*Primary Examiner* — Marvin Payen
(74) *Attorney, Agent, or Firm* — Venable LLP

(57) ABSTRACT

To provide dummy openings having at least one of arrangement and shape determined depending on the shape of a non-effective region.

20 Claims, 6 Drawing Sheets

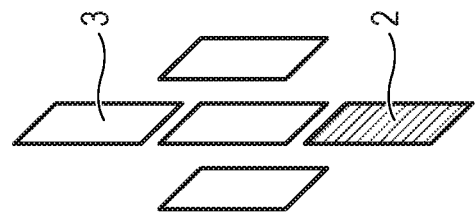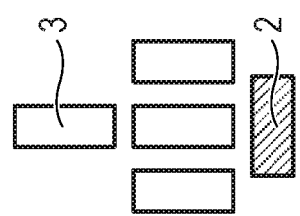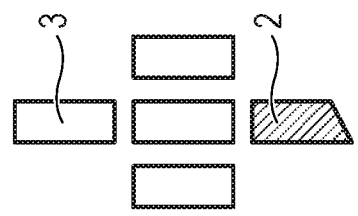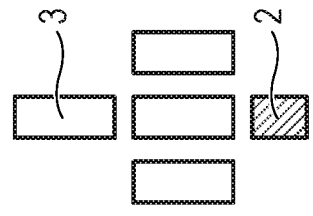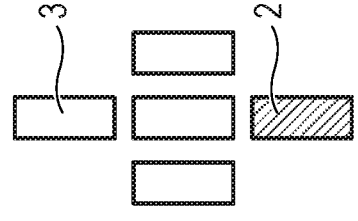

METHOD OF MANUFACTURING SUBSTRATE AND SEMICONDUCTOR DEVICE

BACKGROUND OF THE INVENTION

Field of the Invention

The present invention relates to respective methods of manufacturing a substrate and a semiconductor device to be used for a liquid ejection head for ejecting a liquid.

Description of the Related Art

Manufacture of a silicon substrate to be used for a liquid ejection head sometimes uses anisotropic etching which is wet treatment of silicon for the formation of a desired structure of an ink supply port or the like. By forming a large number of openings serving as ink supply ports in a silicon substrate by such a technique, the silicon substrate may be warped. Also when an ejection orifice or ink flow path is formed by stacking a resin layer on a silicon substrate, the silicon substrate may be warped due to shrinkage of the resin on curing.

As stress due to warpage of the silicon substrate increases, a thin film, such as a membrane film or protecting film, formed on the silicon substrate is sometimes cracked or broken.

Japanese Patent Application Laid-Open No. 2007-250761 describes a method of providing a dummy opening at an outer edge portion of a wafer, cracking the dummy opening intentionally and thereby preventing an ink supply port from being cracked.

The method of Japanese Patent Application Laid-Open No. 2007-250761 can prevent the ink supply port from being cracked, however, the wafer itself is cracked and this inevitably leads to deterioration in rigidity of the entire wafer. In the steps performed thereafter, breakage of the membrane film or wafer may occur.

SUMMARY OF THE INVENTION

A method of manufacturing a substrate according to the invention is characterized in that it includes a film formation step for forming a film on a wafer, a first opening formation step for forming, in a predetermined region of the wafer, first openings penetrating through the wafer, a second opening formation step for forming, in a non-predetermined region between the predetermined region of the wafer and an outer peripheral end of the wafer, second openings penetrating through the wafer and having at least one of arrangement and shape determined depending on the shape of the non-predetermined region and a cutting step for cutting the wafer into substrates equipped with the first openings, respectively.

Further features of the present invention will become apparent from the following description of exemplary embodiments with reference to the attached drawings.

BRIEF DESCRIPTION OF THE DRAWINGS

FIGS. 4A, 4B, 4C, 4D and 4E show arrangement of effective chip openings and dummy openings.

DESCRIPTION OF THE EMBODIMENTS

Figure 1:
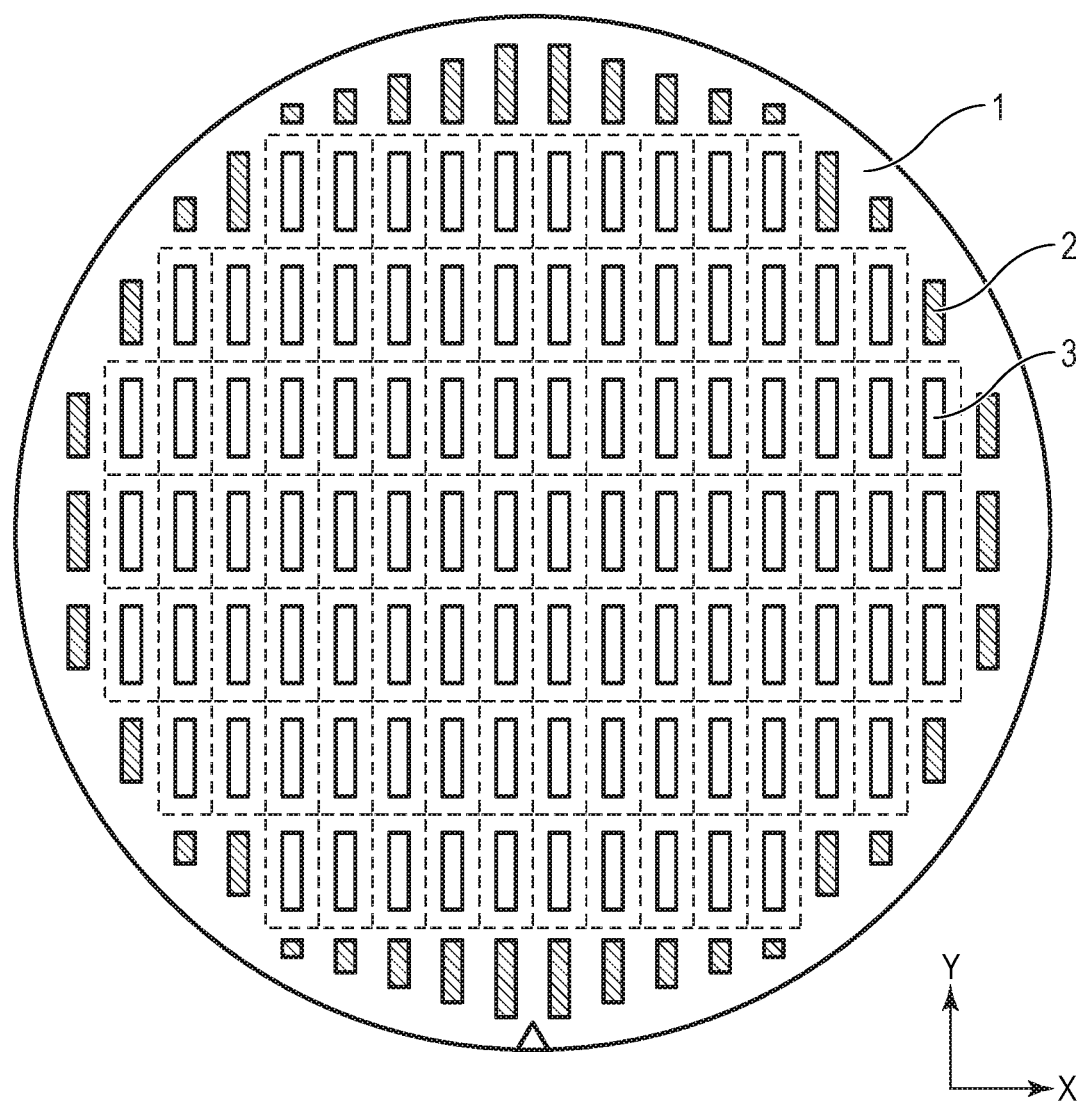
FIG. 1 shows a silicon substrate provided with effective chip openings and dummy openings.

An object of the invention is therefore to provide respective methods of manufacturing a substrate and a semiconductor device to be used for a liquid ejection head which methods can suppress occurrence of breakage of a membrane film or a wafer during manufacturing steps.

First Embodiment of the invention will hereinafter be described referring to some drawings. In the following description, members having the same function will be identified by the same reference numerals and description on them will be omitted.

Figure 2:
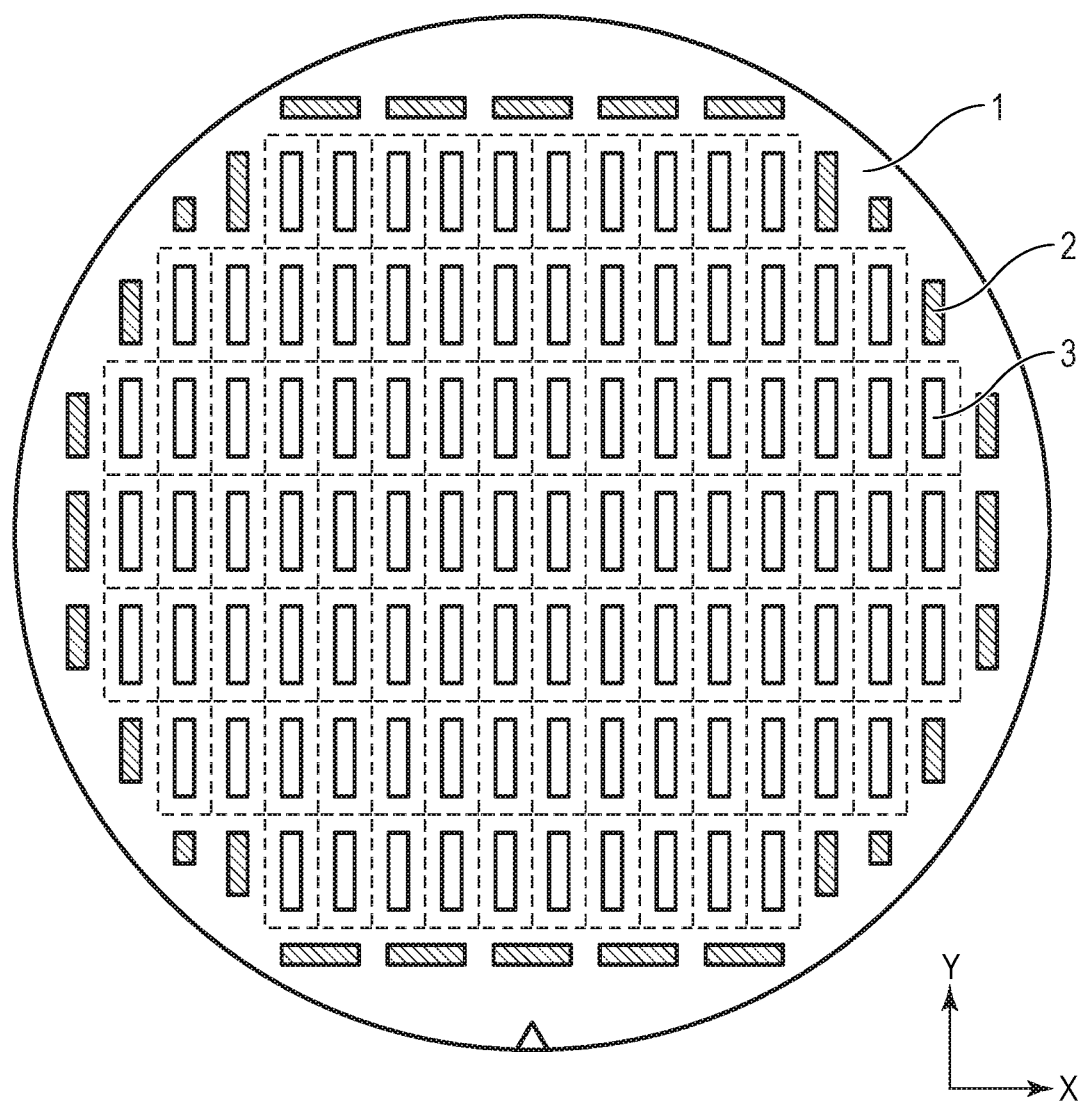
FIG. 2 shows another silicon substrate provided with effective chip openings and dummy openings.
Figure 3:
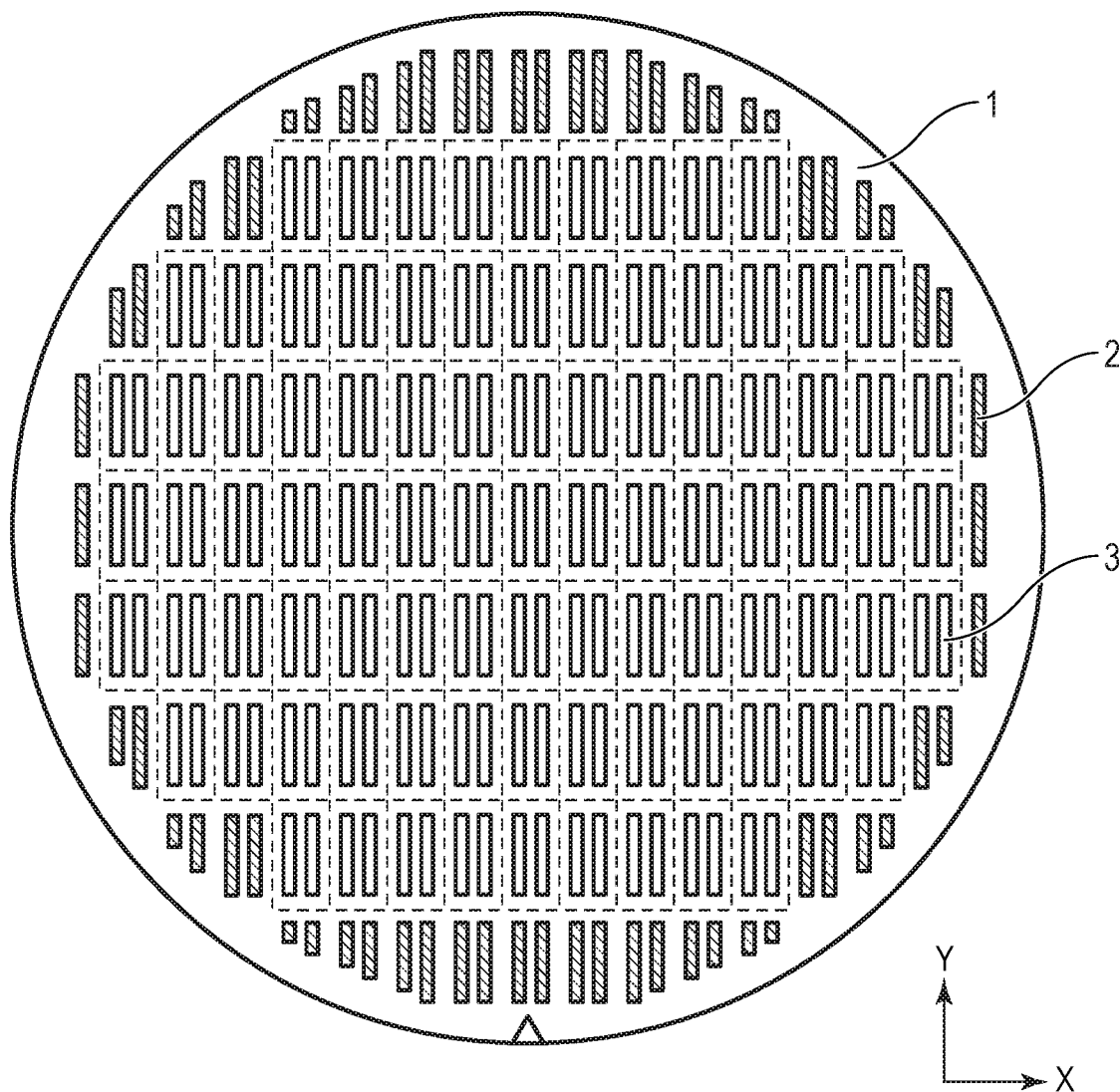
FIG. 3 shows a further silicon substrate provided with effective chip openings and dummy openings.

FIGS. 1, 2, and 3 are each a plan view showing one example of the arrangement of effective chip openings 3 placed within effective regions (predetermined regions) of a silicon substrate 1 for liquid ejection head (which may hereinafter be called "silicon substrate" simply) and dummy openings 2 placed in a non-effective region which is a region outside the effective regions. The term "within effective regions" means within dotted lines in this drawing. The silicon substrate 1 of the present embodiment has, as shown in FIG. 1, a plurality of effective chip openings 3 within the effective regions and a plurality of dummy openings 2 in a region extending between the effective regions and the outer peripheral edge of the silicon substrate 1 (a region outside the predetermined regions) so as to surround the effective regions therewith. The number or shape of the dummy openings 2 depends on the shape of the non-effective region in the silicon substrate 1. The dummy openings 2 may have a shape same as or different from that of the effective chip openings 3. Some of the dummy openings 2 may have the same shape and some may have different shapes, or all the dummy openings may have the same shape. The dummy openings 2 and the effective chip openings 3 of the silicon substrate 1 are symmetric with respect to the center, that is, the intersection where the center line in the direction of the arrow X and the center line in the direction of the arrow Y crosses. By providing dummy openings 2 depending on the shape of the non-effective region, occurrence of breakage of a membrane film or wafer can be suppressed.

As shown in FIG. 2, the dummy openings 2 may have a shape similar to that of the effective chip openings 3 and the longer direction of the dummy openings 2 may be the same as or different from that of the effective chip openings 3. This means that the longer direction of the dummy openings 2 may be the same as the shorter direction of the effective chip openings 3; the longer direction of some of the dummy openings 2 is the same as that of the effective chip openings 3 and the longer direction of some of the dummy openings 2 is different from that of the effective chip openings 3; or the longer direction of all the dummy openings 2 may be the same as that of the effective chip openings 3.

As shown in FIG. 3, the silicon substrate 1 may have, in one effective region thereof, two effective chip openings 3 or three or more effective chip openings. In this case, the arrangement of the dummy openings 2 is not limited to that shown in this drawing insofar as they may be placed depending on the shape of the non-effective region of the silicon substrate 1. The number of the dummy openings 2 may be determined according to the area of the non-effective region.

In the present embodiment, the effective chip openings 3 and the dummy openings 2 are placed so that a ratio of the total opening percentage of the effective chip openings 3 and the dummy openings 2 in the direction of the arrow X to the total opening percentage of the effective chip openings 3 and the dummy openings 2 in the direction of the arrow Y is 0.8 or more to 1.0 or less. Note that, the opening percentage means a ratio of the length of regions within which the effective chip opening 3 and the dummy openings 2 are placed on the straight line from one outer peripheral edge to another outer peripheral edge of the wafer in the each directions ((the total length of the openings on the straight line/the whole length of the line)×100).

FIGS. 4A to 4E each show the arrangement of the effective chip openings 3 and the dummy openings 2, in which the effective chip openings 3 are shown in blank and the dummy openings 2 are shown in wavy lines. FIGS. 4A to 4E show the dummy opening 2 below the effective chip opening 3. The arrangement is not limited to it but the dummy opening may be placed beside or above the effective chip opening. The position of the dummy opening 2 is not limited to one of above, below, left, and right of the effective chip opening 3 and the dummy opening may be placed at two or more or all four of these positions. The distance between the effective chip opening 3 and the dummy openings 2 therearound may all be the same, may be different between the vertical direction and the horizontal direction, or may all be different from one another. The shape of the effective chip openings 3 or dummy openings 2 is not limited to a rectangular (square) shape but may be circle, triangle or polygonal insofar as it permits processing by anisotropic etching of silicon.

Figure 5:
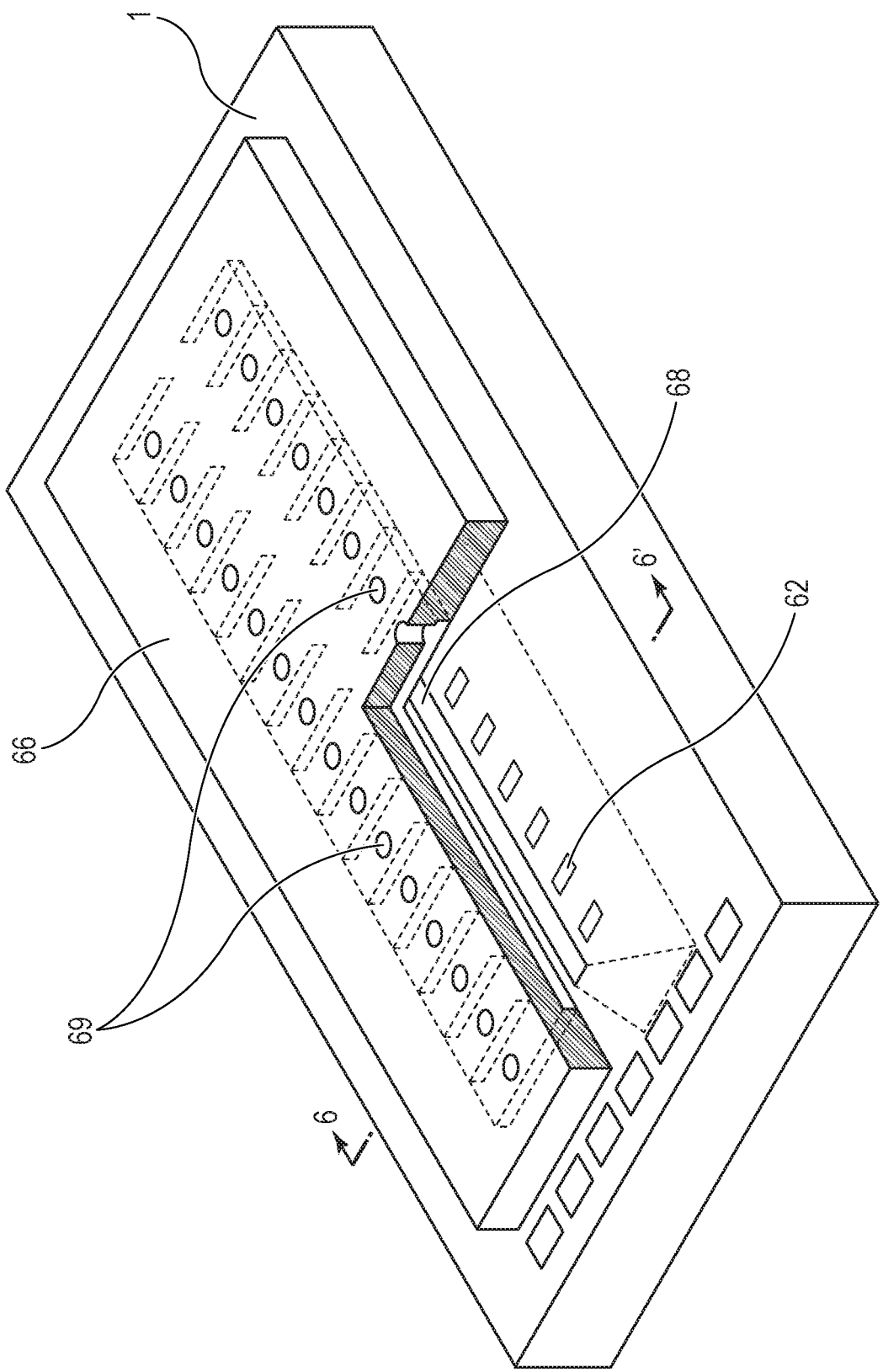
FIG. 5 is a schematic perspective view showing one example of a liquid ejection head.

FIG. 5 is a schematic perspective view showing one example of a liquid ejection head. The liquid ejection head has a silicon substrate 1 having energy generating elements 62 placed with a predetermined pitch and also having a membrane film 63 (refer to FIGS. 6A to 6H described later). The silicon substrate 1 has thereon an ink flow path and ejection orifices 69 opened above the energy generating elements 62 and they are made of an orifice layer 66 constituting a flow path formation member. Rows of the energy generating elements 62 have therebetween an ink supply port 68 opened by anisotropic etching of the silicon substrate 1 made of single crystals having a plane orientation of [100]. The orifice layer 66 constitutes the upper portion of the ink flow path communicated from the ink supply port 68 to each of the ejection orifices 69.

The liquid ejection head carries out recording by applying pressure generated by the energy generating elements 62 to an ink (liquid) with which an ink flow path is filled via the ink supply port 68 and discharging liquid droplets of the ink from the ejection orifices 69 to cause them adhere to a recording medium.

FIGS. 6A to 6H show essential manufacturing steps of a substrate for liquid ejection head according to the invention and they show cross-sections taken along the line 6-6' of FIG. 5 in respective steps. A method of forming a substrate will hereinafter be described in order of manufacturing steps.

Figure 6A:
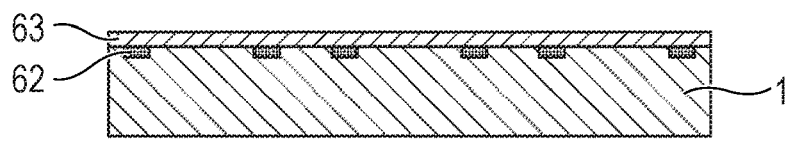
FIGS. 6A, 6B, 6C, 6D, 6E, 6F, 6G and 6H show basic manufacturing steps of a substrate for liquid ejection head.
Figure 6B:
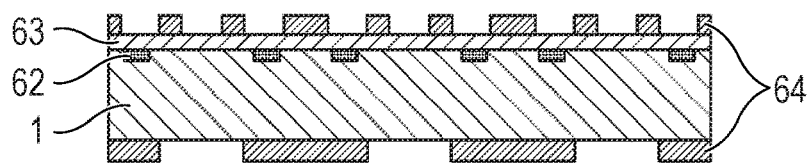
Figure 6C:
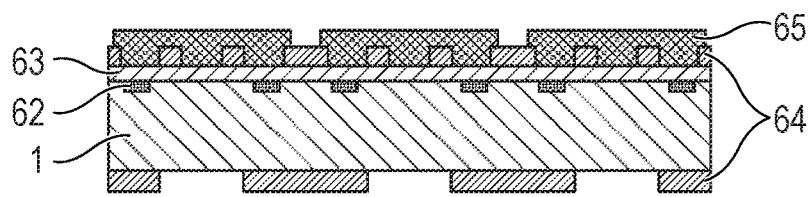

As shown in FIG. 6A, a silicon substrate 1 is provided as a base material. One of the surfaces of the wafer has plane orientation of [100] and the other surface has energy generating elements 62 and has, on the surface thereof, a membrane film 63. This membrane film 63 is not particularly limited insofar as an unnecessary portion of it can be removed by wet etching or dry etching in a step described later. Then, as shown in FIG. 6B, a resin is applied to both surfaces of the substrate by spin coating, direct coating, spraying, or the like to form a protecting layer 64 serving as an adhesion layer of the surface and an etching mask of the back surface. Then, a resist is applied, followed by exposure and development to form a resist pattern. With the resist as a mask, the protecting layer 64 is etched to form desired etching patterns and dummy patterns. After formation of the patterns, as shown in FIG. 6C, a photosensitive resin is applied by spin coating, direct coating, spraying, or the like to form a resin layer 65. By exposure and development, a desired flow path pattern is formed in the resin layer 65.

Figure 6D:
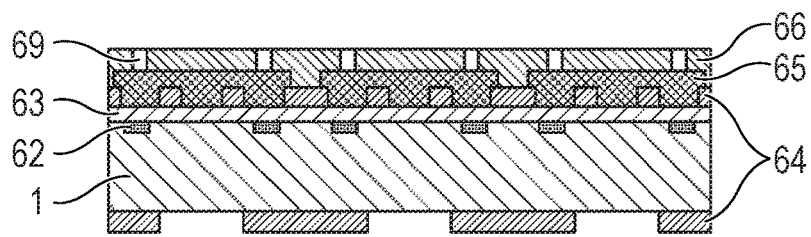
Figure 6E:
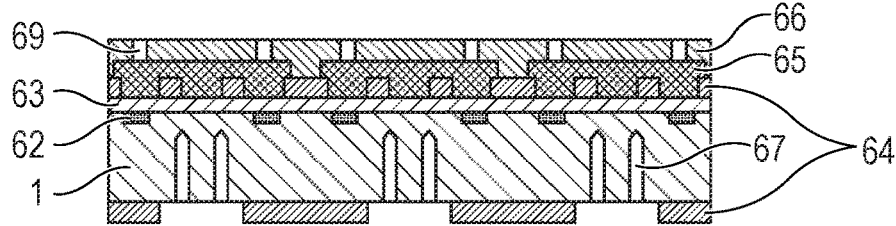
Figure 6F:
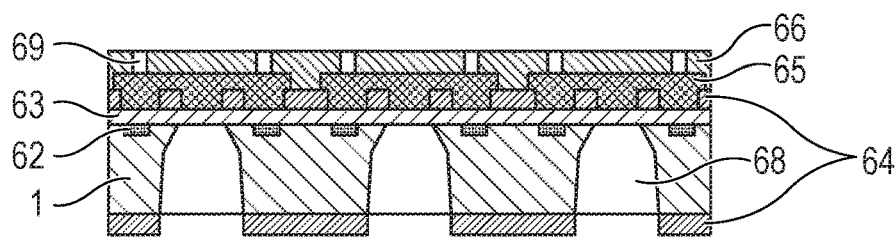

Then, as shown in FIG. 6D, a cover resin which will be an orifice layer 66 is applied onto the resin layer 65 by spin coating, direct coating, spraying or the like. Portions corresponding to ejection orifices 69 are then removed by exposure and development and an orifice layer 66 having ejection orifices 69 is formed. After formation of the orifice layer 66, non-through-holes 67 are made in the back surface of the silicon substrate 1 as shown in FIG. 6E. For making the non-through-holes 67, laser light irradiation, drill or the like can be used. Then, as shown in FIG. 6F, with the protecting layer 64 on the back surface of the silicon substrate 1 as a mask, etching treatment is performed to form ink supply ports 68 in the silicon substrate 1 (opening formation step). An etchant for anisotropic etching of silicon is not particularly limited insofar as it is a compound showing alkalinity demanded for etching of silicon. Examples of the etchant include tetramethylammonium hydroxide (which will hereinafter be called "TMAH"), tetraethylammonium hydroxide, potassium hydroxide (KOH) and sodium hydroxide (NaOH). These solutions may be used either singly or as a mixture of two or more of them. At least one additive may be added for achieving an improved etching rate. Further, the etchant is preferably heated to 40° C. or more to 100° C. or less, more preferably 70° C. or more to 95° C. or less to have a more improved etching rate. The etching treatment may be performed by a batch system in a container having an etchant stored therein after the surface of the orifice layer 66 is protected with cyclized rubber, tape or the like or by a single-wafer system in which the surface to be treated is brought into contact with the etchant while the silicon substrate 1 and container are sealed.

Figure 6G:
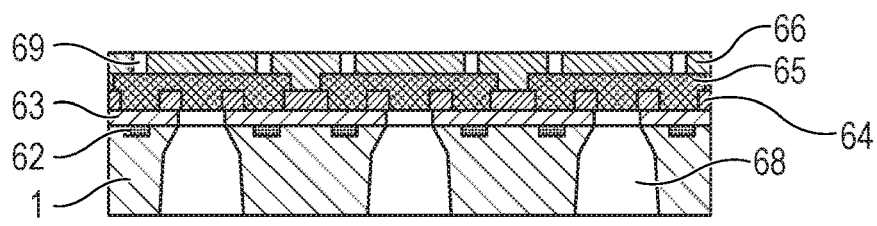
Figure 6H:
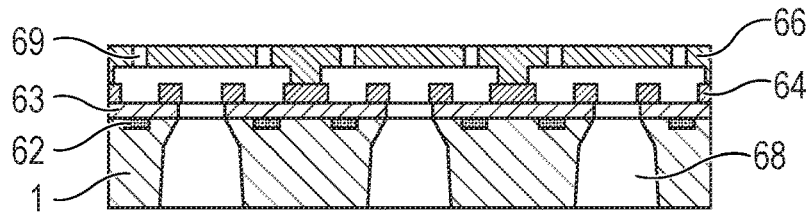

Then, as shown in FIG. 6G, the protecting layer 64 of the back surface which becomes unnecessary after etching of silicon and the membrane film 63 in the ink flow path are removed. This removal may be performed either by a wet system in which the silicon substrate 1 is immersed in a solution or a dry system using an etching gas. As shown in FIG. 6H, the resin layer 65 is removed from the silicon substrate 1 by immersing the silicon substrate 1 having the resin layer 65 and the orifice layer 66 thereon in a solvent capable of dissolving the resin layer 65 therein.

The silicon substrate 1 obtained after these steps is equipped with the ejection orifices 69, the ink supply ports 68 and supply paths communicated therebetween. The silicon substrate 1 thus obtained is cut and separated into chips by a laser sorter, a dicing sorter or the like. A liquid ejection head can be manufactured by bonding an electric wiring for driving the energy generating elements 62 to each of the chips and then bonding a chip tank member for ink supply.

In the present embodiment, a description is made using a silicon wafer as an example, but this embodiment may be used for not only a silicon wafer but also, for example, a silicon carbide wafer.

The invention may also be used for a method of manufacturing a semiconductor device, which is the wafer before cutting and separation.

By use of the above-mentioned methods, the ink supply ports 68 which is the effective chip opening 3 can be formed within the effective region. In addition, the dummy openings 2 can be formed by the method similar to form the effective chip opening 3 or different methods (ex. dry etching). In the case that the dummy openings 2 is formed by the method similar to form the effective chip opening 3, the dummy openings 2 can be formed at the same time (i.e. in the same step) when the effective chip opening 3 is formed. Thus, dummy openings 2 penetrating through the wafer and having at least one of the arrangement and shape determined depending on the shape of the non-effective region are provided in the non-effective region. This makes it possible to realize respective methods of manufacturing a substrate and a semiconductor device used for a liquid ejection head which methods are capable of suppressing occurrence of breakage of the membrane film 63 or wafer in the manufacturing steps.

EXAMPLES

Example 1

A wafer having a silicon nitride film as the membrane film 63 was used and a leading hole was formed in an etching pattern and a dummy pattern of the silicon substrate 1 by laser. Then, the silicon substrate 1 thus obtained by laser processing was subjected to wet etching treatment at 83° C. with an etchant having 22 parts by weight of TMAH to form effective chip openings 3 serving as an ink supply port 68 and dummy openings 2. The percent defective of the membrane in the resulting silicon substrate 1 was 0%.

Example 2

Effective chip openings 3 serving as the ink supply port 68 and dummy openings 2 were formed by using a method similar to that of Example 1 and differentiating the shape between dummy patterns and etching patterns. The percent defective of the membrane in the resulting silicon substrate 1 was 0%.

Example 3

Effective chip openings 3 serving as the ink supply port 68 and dummy openings 2 were formed by using a method similar to that of Example 1 and differentiating the longer direction between dummy patterns and etching patterns. The percent defective of the membrane in the resulting silicon substrate 1 was 0%.

Example 4

By using a method similar to that of Example 1, the effective chip openings 3 and the dummy openings 2 were arranged so that a ratio of the total opening percentage of the effective chip openings 3 and the dummy openings 2 in the direction of the arrow X to the total opening percentage of the effective chip openings 3 and the dummy openings 2 in the direction of the arrow Y became 1. The percent defective of the membrane in the resulting silicon substrate 1 was 0%.

Example 5

By using a method similar to that of Example 1, the effective chip openings 3 and the dummy openings 2 were arranged so that a ratio of the total opening percentage of the effective chip openings 3 and the dummy openings 2 in the direction of the arrow X to the total opening percentage of the effective chip openings 3 and the dummy openings 2 in the direction of the arrow Y became 0.8. The percent defective of the membrane in the resulting silicon substrate 1 was 0%.

Comparative Example 1

By using a method similar to that of Example 1, the silicon substrate 1 was etched without placing dummy patterns. Then, the defective membrane appeared during formation of ink supply ports by wet etching. The percent defective of the membrane was 6%.

Comparative Example 2

By using a method similar to that of Example 1, the effective chip openings 3 and the dummy openings 2 were placed so that a ratio of the total opening percentage of the effective chip openings 3 and the dummy openings 2 in the direction of the arrow X to the total opening percentage of the effective chip openings 3 and the dummy openings 2 in the direction of the arrow Y became 0.75. Then, the defective membrane appeared during formation of ink supply ports by wet etching. The percent defective of the membrane was 3%.

The present inventors can confirm based on the percent defective in Examples and Comparative Examples that the advantage of the invention can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-154555, filed on Aug. 9, 2017, which is hereby incorporated by reference herein in its entirety.

What is claimed is:

1. A method of manufacturing a substrate, comprising:
   a film formation step for forming a film on a silicon wafer;
   a first opening formation step for forming, in a predetermined region of the silicon wafer, first openings that penetrate through the silicon wafer;
   a second opening formation step for forming, in a non-predetermined region between the predetermined region of the silicon wafer and an outer peripheral end of the silicon wafer, second openings that penetrate through the silicon wafer and have at least one of arrangement and shape determined depending on a shape of the non-predetermined region; and
   a cutting step for cutting the silicon wafer into substrates equipped with the first openings, respectively.

2. The method according to claim 1, wherein the number of the second openings formed in the second opening formation step is determined based on an area of the non-predetermined region.

3. The method according to claim 1, wherein the first opening formation step and the second opening formation step are steps of forming openings by etching.

4. The method according to claim 1, wherein in the first opening formation step and the second opening formation step, both the first openings and the second openings are formed while being arranged point symmetric with respect to a center of the silicon wafer.

5. The method according to claim 1, wherein the first openings formed in the first opening formation step have a rectangular shape.

6. The method according to claim 5, wherein a ratio of a total opening percentage of the first openings and the second openings in a shorter direction of the first openings to a total opening percentage of the first openings and the second openings in a longer direction of the first openings is 0.8 to 1.0.

7. The method according to claim 5, wherein the second openings formed in the second opening formation step have a rectangular shape.

8. The method according to claim 7, wherein a longer direction of the first openings is different from a longer direction of the second openings.

9. The method according to claim 1, wherein the second openings formed in the second opening formation step have a plurality of shapes different from each other.

10. The method according to claim 9, wherein the second openings formed in the second opening formation step have a polygonal shape.

11. A method of manufacturing a semiconductor device, comprising:
 a film formation step for forming a film on a silicon wafer; and
 a first opening formation step for forming, in a predetermined region of the silicon wafer, first openings that penetrate through the silicon wafer;
 wherein the method further comprises a second opening formation step for forming, in a non-predetermined region between the predetermined region of the silicon wafer and an outer peripheral end of the silicon wafer, second openings that penetrate through the silicon wafer and have at least one of arrangement and shape determined depending on the shape of the non-predetermined region.

12. The method according to claim 11, wherein the number of the second openings formed in the second opening formation step is determined based on an area of the non-predetermined region.

13. The method according to claim 11, wherein the first opening formation step and the second opening formation step are steps of forming openings by etching.

14. The method according to claim 11, wherein in the first opening formation step and the second opening formation step, both the first openings and the second openings are formed while being arranged point symmetric with respect to a center of the silicon wafer.

15. The method according to claim 11, wherein the first openings formed in the first opening formation step have a rectangular shape.

16. The method according to claim 15, wherein a ratio of a total opening percentage of the first openings and the second openings in a shorter direction of the first openings to a total opening percentage of the first openings and the second openings in a longer direction of the first openings is 0.8 to 1.0.

17. The method according to claim 15, wherein the second openings formed in the second opening formation step have a rectangular shape.

18. The method according to claim 17, wherein a longer direction of the first openings is different from a longer direction of the second openings.

19. The method according to claim 11, wherein the second openings formed in the second opening formation step have a plurality of shapes different from each other.

20. The method according to claim 19, wherein the second openings formed in the second opening formation step have a polygonal shape.

* * * * *